(12) United States Patent
Hida et al.

(10) Patent No.: US 7,242,132 B2
(45) Date of Patent: Jul. 10, 2007

(54) PIEZOELECTRIC ACTUATOR AND HEAD ASSEMBLY USING THE PIEZOELECTRIC ACTUATOR

(75) Inventors: Masaharu Hida, Kawasaki (JP); Tsuyoshi Mita, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 11/098,369

(22) Filed: Apr. 5, 2005

(65) Prior Publication Data

US 2005/0168107 A1 Aug. 4, 2005

Related U.S. Application Data

(63) Continuation of application No. PCT/JP03/04855, filed on Apr. 16, 2003.

(51) Int. Cl.
*H01L 41/08* (2006.01)

(52) U.S. Cl. .................. 310/328; 310/332; 310/367

(58) Field of Classification Search ............... 310/328, 310/330–332; 360/234.6, 294.1, 294.4
See application file for complete search history.

(56) References Cited

U.S. PATENT DOCUMENTS

| | | | |
|---|---|---|---|
| 5,568,679 A | | 10/1996 | Ohya et al. |
| 6,636,388 B2 * | | 10/2003 | Stefansky ............... 360/294.5 |
| 6,671,131 B2 * | | 12/2003 | Kasajima et al. ........ 360/294.4 |
| 6,700,749 B2 * | | 3/2004 | Shiraishi et al. ......... 360/294.4 |
| 7,006,333 B1 * | | 2/2006 | Summers ................. 360/294.4 |
| 7,023,663 B2 * | | 4/2006 | Yao et al. ................ 360/234.6 |
| 7,059,868 B1 * | | 6/2006 | Yan .............................. 439/67 |

FOREIGN PATENT DOCUMENTS

| | | |
|---|---|---|
| JP | 62-199075 | 9/1987 |
| JP | 11-121820 | 4/1999 |
| JP | 2001-68749 | 3/2001 |
| JP | 2001-94164 | 4/2001 |
| JP | 2001-308402 | 11/2001 |
| JP | 2003-59219 | 2/2003 |

* cited by examiner

*Primary Examiner*—Mark Budd
(74) *Attorney, Agent, or Firm*—Armstrong, Kratz, Quintos, Hanson & Brook, LLP

(57) ABSTRACT

A head assembly includes a suspension having a gimbal, a flexible printed wiring sheet having a plurality of conductor patterns and adhered to the suspension, first and second piezoelectric actuators mounted on the gimbal, and a head slider mounted on the first and second piezoelectric actuators. The first and second piezoelectric actuators are adhered to the gimbal at end portion adhesion portions symmetrical with respect to the center of pivotal motion thereof and are adhered to the head slider at end portion adhesion portions on the opposite side disposed symmetrically with respect to the center of pivotal motion similarly. Consequently, when a voltage is applied to the first and second piezoelectric actuators through the flexible printed wiring sheet, a couple of forces can be generated which vary the posture of the head slider only in one direction around the center of pivotal motion.

4 Claims, 13 Drawing Sheets

PIEZOELECTRIC ACTUATOR AND HEAD ASSEMBLY USING THE PIEZOELECTRIC ACTUATOR

This is a continuation of PCT International Application No. PCT/JP03/04855, filed Apr. 16, 2003, which was not published in English.

BACKGROUND OF THE INVENTION

1. Field of the Invention

This invention relates to a piezoelectric actuator used as a tracking actuator for a magnetic disk apparatus and a head assembly which uses the piezoelectric actuator.

2. Description of the Related Art

In recent years, reductions in the size and thickness of a magnetic disk apparatus, which is a kind of external storage apparatus for computers, has been and is proceeding, and further reduction in power consumption is demanded. Also, increases in recording density and capacity of magnetic disk apparatuses is demanded. An increase in the capacity of a magnetic disk apparatus can be achieved generally by increasing the recording capacity per disk. However, if the recording capacity is increased without changing the diameter of the disk, then the track pitch decreases. Therefore, it is a technical problem how to achieve accurate positioning of a head element which performs reading out from and writing on a recording track, and a head actuator having a high degree of positioning accuracy is demanded.

Conventionally, in order to achieve high accuracy head positioning in a magnetic disk apparatus, generally it has been attempted to enhance the rigidity of a movable part such as an actuator arm to raise the main resonance point frequency in the in-plane direction. However, there is a limitation to the enhancement of the resonance point, and even if the in-plane resonance point of the movable part can be raised by a great amount, the problem that vibration originating from the spring characteristic of a bearing which supports the movable element is generated and deteriorates the positioning accuracy cannot be solved.

As one of the countermeasures for solving such problems, a so-called double actuator wherein a second actuator for track following, that is, a tracking actuator, is mounted at an end of an arm of a head actuator. The tracking actuator moves the head provided at an end portion of the arm by a very small amount independently of movement of the head actuator to achieve tracking of the head.

Such tracking actuators are roughly divided into three types. According to the first type, the tracking actuator is provided between the end of the actuator arm and a suspension. According to the second type, the tracking actuator is provided between a gimbal formed at an end of the suspension and the head slider. According to the third type, only a magnetic head element (electromagnetic transducer) formed integrally on the head slider is moved.

The three types of tracking actuators (microactuators) individually have advantages and disadvantages. The first type is advantageous in that, because the tracking actuator section is comparatively large and an expansion mechanism can be used at an end of the head, the displacement of the tracking actuator section need not be set very great. However, the first type has a limitation whenever the resonance frequency is attempted to be raised. The third type can achieve a considerably high resonance frequency. However, the third type involves difficulty in the production process and requires production of displacement by a great amount by means of a tracking actuator. The second type has intermediate features.

A head assembly having a tracking actuator of the second type is disclosed in Japanese Patent Laid-Open No. Hei 11-273041. In the head assembly, two piezoelectric actuators extend in parallel to each other toward a head slider from a common first fixed member secured to a suspension. An end of each of the piezoelectric actuators is connected to a common second fixed member on the head slider. The head slider can make a rocking motion around the first fixed member based on expansion and contraction of the piezoelectric actuators. In particular, when the piezoelectric actuators expand and contract, the head slider can displace by a very small distance in a radial direction of, for example, a magnetic disk. As a result, the magnetic head element on the head slider can continue to follow up a recording track on the magnetic disk with a high degree of accuracy.

The characteristics required for the tracking actuator of the second type are that the center axis of the slider and the axis of pivotal motion of the tracking actuators coincide with each other, that the amount of movement is 1 µm or more when a voltage equal to or lower than 30 V is applied and that the in-plane resonance frequency is 20 kHz or more. A head assembly which includes a tracking actuator which satisfies the characteristics described above has been proposed by the assignee of the present application (Japanese Patent Application No. 2001-318985). In the head assembly of the preceding application, a pair of piezoelectric actuators are disposed in parallel to each other, and the piezoelectric actuators are contracted to pivot a slider in one direction to achieve tracking. For the power supply, it is necessary to form driving wirings for the two piezoelectric actuators and wirings for the head element on the suspension. From the point of view of securing of the space for wirings and the degree of freedom in design, it is preferable to minimize the number of wirings to be formed on the suspension. Further, in order to lead out electrodes from a portion which is not secured to the suspension, it is necessary for the electrode leading out portion to have a structure which does not disturb deformation of the piezoelectric actuators when a voltage is applied.

Usually, a multi-layer piezoelectric element is used for a piezoelectric actuator. A multi-layer piezoelectric element is individually cut out from a piezoelectric substrate obtained by baking a multi-layer green sheet using a dicing saw or the like. In the case of a piezoelectric actuator used for very small displacement of a magnetic head of a magnetic disk apparatus, the thickness of each layer is several tens of µm or less in order to obtain a desired displacement amount or from a restriction in dimension. Therefore, if metal sag upon cutting of the piezoelectric substrate is produced, there is the possibility that the sag may cause short-circuiting between electrodes. Further, if Ag—Pd is used for the electrodes, then there is the possibility that use of the electrodes under a high-temperature high-humidity condition may unfavorably give rise to migration of Ag.

SUMMARY OF THE INVENTION

Therefore, it is an object of the present invention to provide a head assembly having a wiring structure by which an electrode leading out portion does not disturb deformation of a piezoelectric actuator upon application of a voltage.

It is another object of the present invention to provide a piezoelectric actuator which can eliminate sag of an electrode upon cutting of individual piezoelectric actuators and enhance the electric reliability and a method of producing the piezoelectric actuator.

According to an aspect of the present invention, there is provided a head assembly, including a suspension having a gimbal, a flexible printed wiring sheet having a plurality of first conductor patterns for driving a piezoelectric actuator, a plurality of first pads individually connected to ends of the first conductor patterns, a plurality of second conductor patterns for head element driving, and a plurality of second pads individually connected to ends of the second conductor patterns, the flexible printed wiring sheet being adhered to the suspension except the first pads such that the first and second pads are positioned on the gimbal, a first piezoelectric actuator having a first face, a second face on the opposite side to the first face, a first end, a second end, a plurality of first electrodes, a plurality of second electrodes provided alternately with the first electrodes, a first adhesion portion provided on the first face adjacent the first end, and a second adhesion portion provided on the second face adjacent the second end, the first piezoelectric actuator being adhered at the first adhesion portion thereof to the gimbal, a second piezoelectric actuator having a third face on the same side as that of the first face, a fourth face on the opposite side to the third face, a third end on the same side as that of the first end, a fourth end, a plurality of third electrodes, a plurality of fourth electrodes provided alternately with the third electrodes, a third adhesion portion provided on the third face adjacent the fourth end, and a fourth adhesion portion provided on the fourth face adjacent the third end, the second piezoelectric actuator being disposed substantially in parallel to the first piezoelectric actuator and adhered at the third adhesion portion thereof to the gimbal, a head slider mounted on the first and second piezoelectric actuators and adhered to the first piezoelectric actuator at the second adhesion portion and to the second piezoelectric actuator at the fourth adhesion portion, the head slider having a head element and a plurality of terminals connected to the head element, and elements for individually connecting the second pads to the terminals. The first pads are individually connected to the first, second, third and fourth electrodes.

Preferably, the gimbal has openings at portions thereof which correspond to the first pads, and the first pads are bent substantially at a right angle individually connected to the first and second ends of the first piezoelectric actuator and the third and fourth ends of the second piezoelectric actuator. Further preferably, each of the first pads has a plating solder film thereon, and the first pads are individually soldered to the first and second ends of the first piezoelectric actuator and to the third and fourth electrodes of the second piezoelectric actuator.

According to another aspect of the present invention, there is provided a method of producing a piezoelectric actuator, including the steps of preparing a plurality of first green sheets each having a first electrode pattern and a plurality of second green sheets each having a second electrode pattern, laminating the first green sheets and the second green sheets alternately such that the first electrode patterns and the second electrode patterns partly overlap with each other and contact bonding the first and second green sheets to obtain a green sheet lamination article, blanking the green sheet lamination article at least at a portion thereof which includes the first and second patterns into a desired shape, baking the blanked green sheet lamination article at a first predetermined temperature to obtain a piezoelectric substrate, cutting the piezoelectric substrate in a first direction at a portion which includes only the first electrode patterns and another portion which includes only the second electrode patterns to obtain a bar-shaped piezoelectric substrate, forming an electrode on the cut face of the bar-shaped piezoelectric substrate, and cutting the bar-shaped piezoelectric substrate in a second direction perpendicular to the first direction at a position at which the bar-shaped piezoelectric substrate includes the blanked portion.

Preferably, the method of producing a piezoelectric actuator further includes, prior to the baking step, a step of heating the blanked green sheet lamination article at a second predetermined temperature lower than the first predetermined temperature to degrease the blanked green sheet lamination article. Preferably, each of the first and second green sheets is formed from a $PbNi_{1/3}Nb_{2/3}O_3$—$PbTiO_3$—$PbZrO_3$ green sheet. Each of the first and second electrode patterns may be formed from Pt paste, and the Pt paste may contain powder of $PbNi_{1/3}Nb_{2/3}O_3$—$PbTiO_3$—$PbZrO_3$ by approximately 10 to 30 volume %.

According to a further aspect of the present invention, there is provided a piezoelectric actuator, including a piezoelectric ceramic member having a first end and a second end, a plurality of first electrodes embedded in the piezoelectric ceramic member in such a manner as to extend to the first end, a plurality of second electrode embedded in the piezoelectric ceramic member alternately with the first electrodes in such a manner as to extend to the second ends, a first end portion electrode formed at the first end for connecting the plurality of first electrodes, and a second end portion electrode formed at the second end for connecting the plurality of second electrodes. Side faces of the first and second electrodes at a portion at which the first and second electrodes overlap with each other are retracted from a side face of the piezoelectric ceramic member or covered with the piezoelectric ceramic member.

Preferably, the piezoelectric ceramic member is made of $PbNi_{1/3}Nb_{2/3}O_3$—$PbTiO_3$—$PbZrO_3$ ceramic. Preferably, each of the first and second electrodes is made of a blended material of Pt and $PbNi_{1/3}Nb_{2/3}O_3$—$PbTiO_3$—$PbZrO_3$ ceramic, and the $PbNi_{1/3}Nb_{2/3}O_3$—$PbTiO_3$—$PbZrO_3$ ceramic is mixed by 10 to 30 volume %.

The above and other objects, features and advantages of the present invention and the manner of realizing them will become more apparent, and the invention itself will best be understood, from a study of the following description and appended claims with reference to the attached drawings showing some preferred embodiments of the invention.

DETAILED DESCRIPTION OF THE PREFERRED EMBODIMENTS

Figure 1:
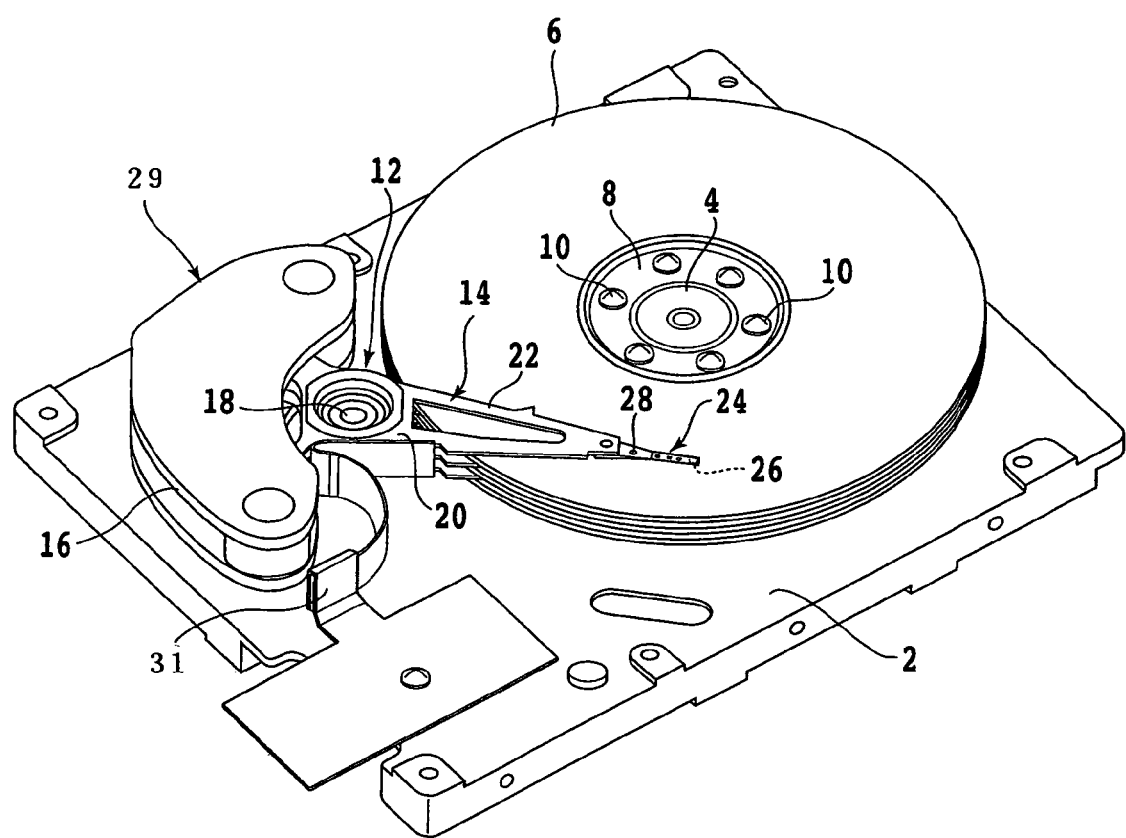
FIG. 1 is a perspective view of a magnetic disk apparatus in a state wherein a cover is removed.

In the following, the present invention is described in detail with reference to the drawings. Referring to FIG. 1, there is shown a perspective view of a magnetic disk apparatus in a state wherein a cover is removed. A shaft 4 is secured to a base 2, and a spindle hub (not shown) which is driven to rotate by a DC motor is provided around the shaft 4. Magnetic disks 6 and spacers (not shown) are inserted alternately in the spindle hub, and a disk clamp 8 is fastened to the spindle hub by means of a plurality of screws 10 to attach the plurality of magnetic disks 6 in a spaced relationship by a predetermined distance from each other to the spindle hub.

Reference numeral 12 denotes a rotary actuator composed of an actuator arm assembly 14 and a magnetic circuit 16. The actuator arm assembly 14 is mounted for pivotal motion around a shaft 18 secured to the base 2. The actuator arm assembly 14 includes an actuator block 20 attached for rotation around the shaft 18 through a single bearing, a plurality of actuator arms 22 extending in one direction from the actuator block 20, and a head assembly 24 secured to an end portion of each of the actuator arms 22.

Each of the head assemblies 24 includes a head slider 26 having an electromagnetic transducer (magnetic head element) for writing/reading data on/from a magnetic disk 6, a suspension 28 supporting the head slider 26 at an end thereof and secured at a base end portion thereof to an actuator arm 22, and first and second piezoelectric actuators hereinafter described in detail which are provided between the suspension 28 and the head slider 26. A coil (not shown) is supported on the side opposite to the actuator arm 22 with respect to the shaft 18, and the coil is inserted into a gap of the magnetic circuit 16 to form a voice coil motor (VCM) 29. Reference numeral 31 denotes a flexible printed wiring board (FPC) for supplying writing signals to the magnetic head elements and extracting read signals from the magnetic head elements. The flexible printed wiring board 32 is secured at an end thereof to a side face of the actuator block 20.

Figure 2:
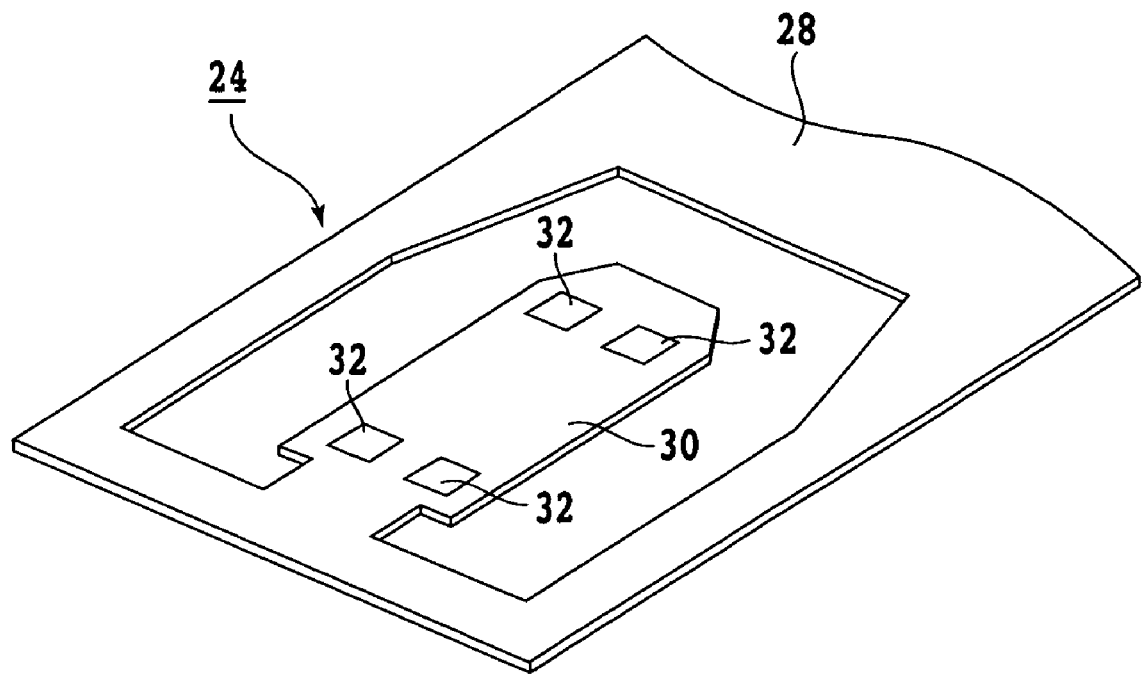
FIG. 2 is an exploded perspective view of a head assembly of an embodiment of the present invention.
Figure 2:
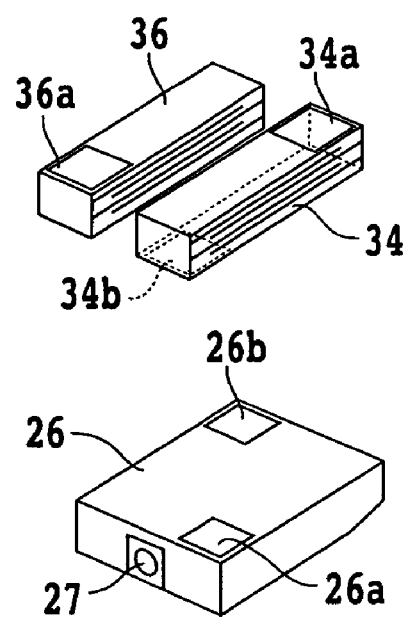

Referring to FIG. 2, there is shown a schematic exploded perspective view of the head assembly 24 according to an embodiment of the present invention. A gimbal 30 is formed integrally at an end portion of the suspension 28 and has four openings (cutouts) 32 provided at a position thereof at which a pad (hereinafter described) is mounted. An elongated first piezoelectric actuator 34 and a similar elongated second piezoelectric actuator 36 are mounted on the gimbal 30. In particular, the first piezoelectric actuator 34 is adhered at a base end portion 34a thereof to the gimbal 30 and has the head slider 26 adhered to a tip end portion 34b thereof. Similarly, the second piezoelectric actuator 36 is adhered at a base end portion 36a thereof to the gimbal 30 and has the head slider 26 adhered to a tip end portion 36b thereof. The first and second piezoelectric actuators 34 and 36 are disposed substantially in parallel with each other. The base end portions (adhesion portions to the gimbal) 34a and 36a of the first and second piezoelectric actuators 34 and 36 are disposed symmetrically with respect to the pivotal center CR (refer to FIG. 3) which extends perpendicularly to the surface of the gimbal 30. Similarly, the tip ends (adhesion portions to the head slider 26) 34b and 36b of the first and second piezoelectric actuators 34 and 36 are disposed symmetrically with respect to the pivotal center CR as well.

The head slider 26 has a magnetic head element 27 formed integrally thereon and is adhered at adhesion portions 26a and 26b thereof to the first and second piezoelectric actuators 34 and 36, respectively. The magnetic head element 27 includes, for example, a writing element such as a thin film magnetic head used to write information on a magnetic disk and a read element such as a giant magnetic resistance element (GMR) or a tunnel junction magnetic resistance element (TMR) used to read information from a magnetic disk.

Figure 3:
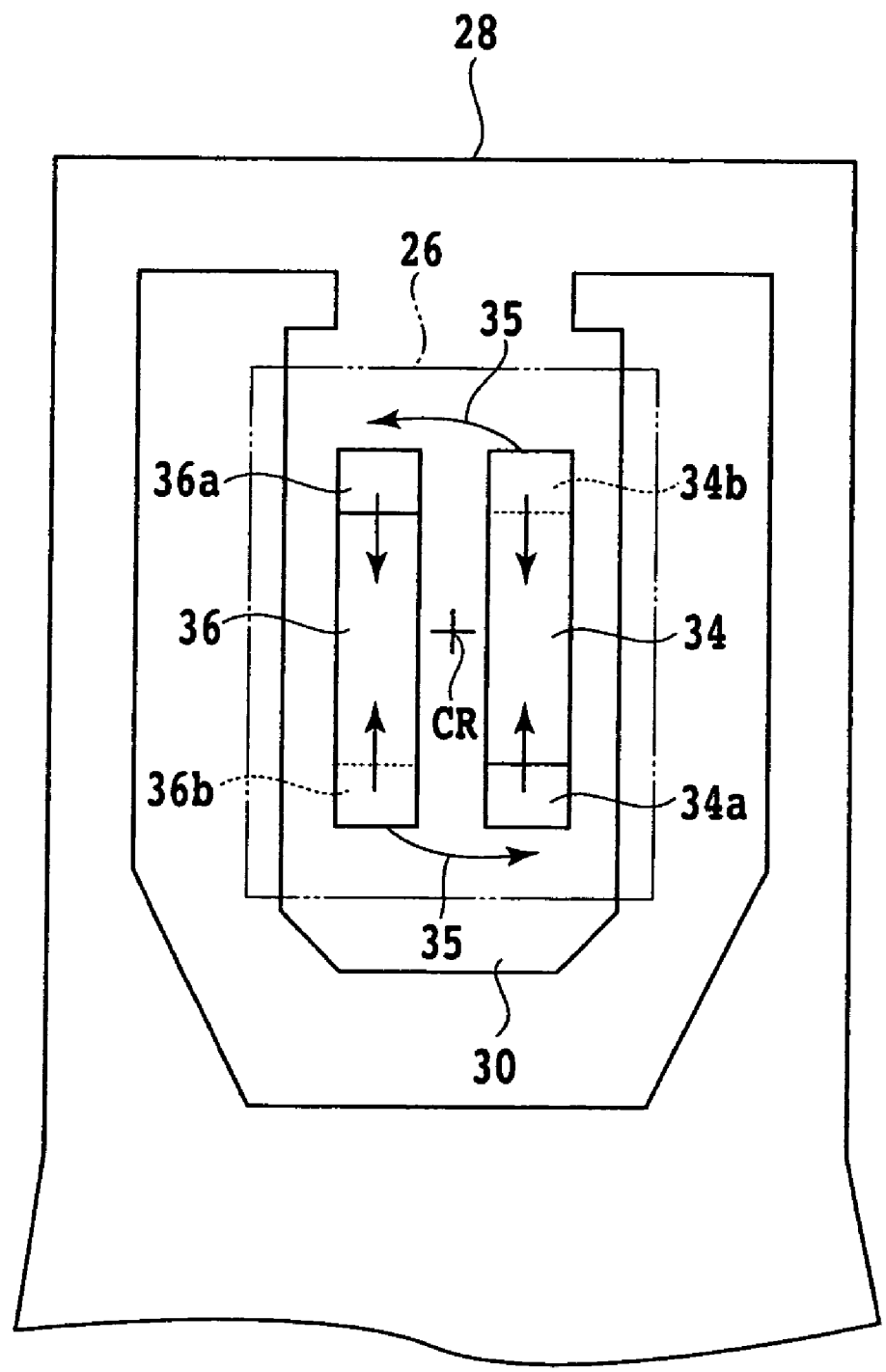
FIG. 3 is a plan view illustrating an action of first and second piezoelectric actuators.

As shown in FIG. 3, the adhesion portions 34a and 36a of the first and second piezoelectric actuators 34 and 36 are disposed symmetrically with respect to the pivotal center CR. Similarly, the tip ends 34b and 36b of the first and second piezoelectric actuators 34 and 36 are disposed symmetrically with respect to the pivotal center CR. Accordingly, if both of the first and second piezoelectric actuators 34 and 36 contract with a voltage applied thereto, then a couple of forces are generated in the direction indicated by an arrow mark 35 around the pivotal center CR. As a result, the head slider 26 pivots in the counterclockwise direction around the pivotal center CR to cause a change in posture of the head slider 26 so that the magnetic head element 27 can follow up a target track. If the application of the voltage is canceled, then the first and second piezoelectric actuators 34 and 36 expand to their original shape, and the head slider 26 rotates in the clockwise direction around the pivotal center CR to restore the reference posture.

Figure 4:
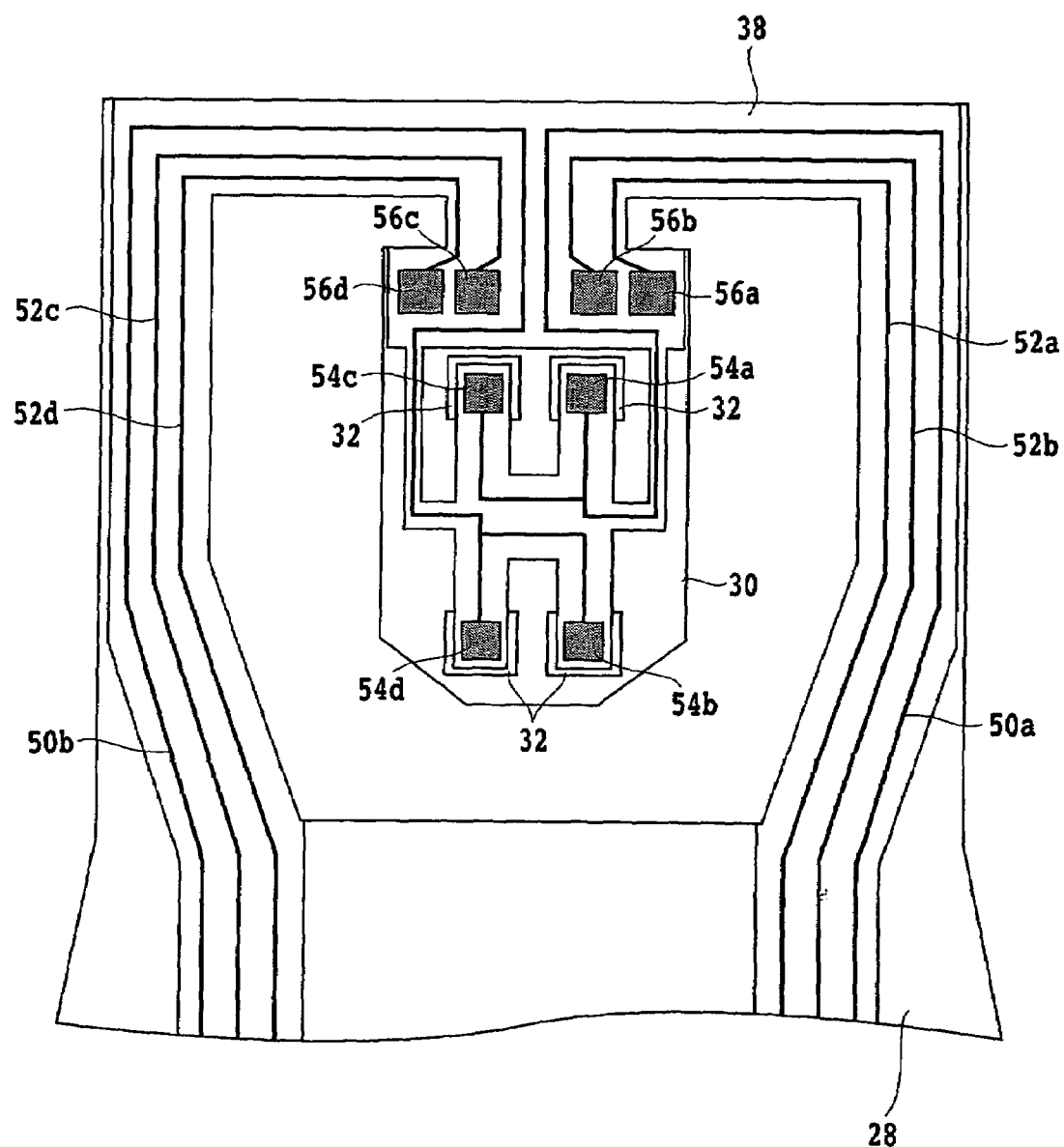
FIG. 4 is a plan view showing a wiring pattern where an FPC is used.

Referring to FIG. 4, there is shown a wiring structure of the present invention which uses a flexible printed wiring sheet (FPC sheet) 38. The suspension 28 is formed from a stainless steel plate, and the FPC sheet 38 is adhered to the suspension 28. The FPC sheet 38 is formed from conductor patterns 50a, 50b, 52a, 52b, 52c and 52d made of, for example, gold and sandwiched between a pair of polyimide films. The conductor patterns 50a and 50b are conductor patterns for driving the piezoelectric actuators 34 and 36, respectively, and an end of the conductor pattern 50a is connected to conductor pads 54a and 54c while an end of the conductor pattern 50b is connected to conductor pads 54b and 54d. Because the conductor pads 54a to 54d are positioned in the openings 32 formed in the gimbal 30, they are not adhered to the suspension 28. Meanwhile, the conductor patterns 52a and 52b are conductor patterns for a writing element and are connected at ends thereof to the conductor pads 56a and 56b. The conductor patterns 52c and 52d are conductor patterns for a reading element and are connected at ends thereof to the conductor pads 56c and 56d, respectively.

Figure 5:
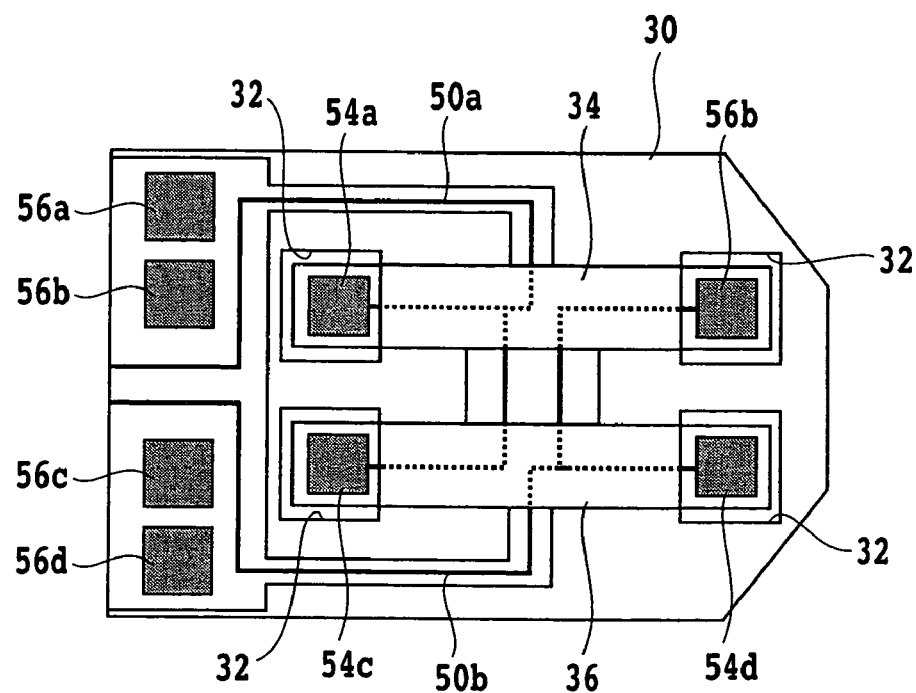
FIG. 5 is a plan view of the first and second piezoelectric actuators in a state wherein they are mounted on a gimbal.
Figure 6:
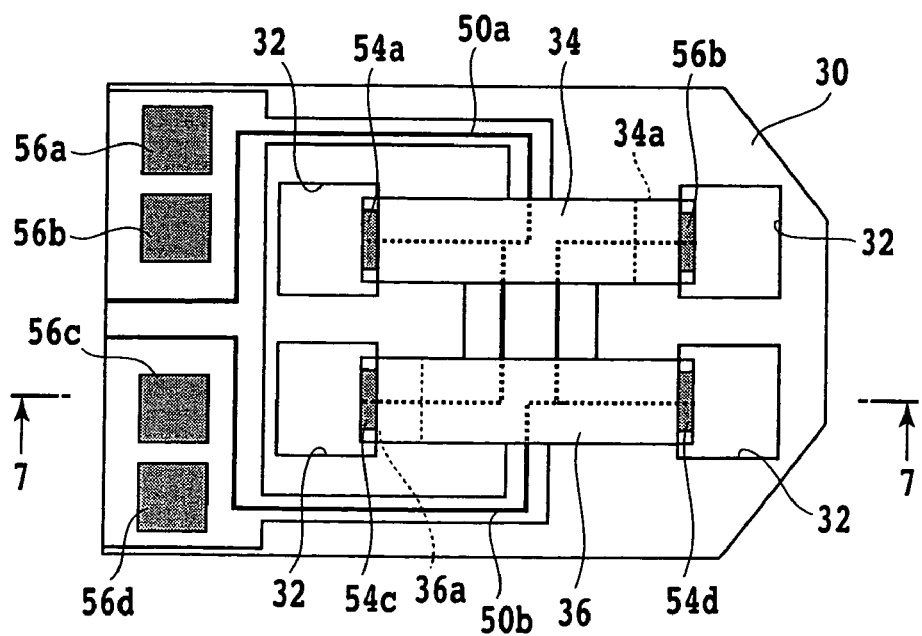
FIG. 6 is a plan view of pads in a state wherein they are bent and soldered to electrodes of the first and second piezoelectric actuators.
Figure 7:
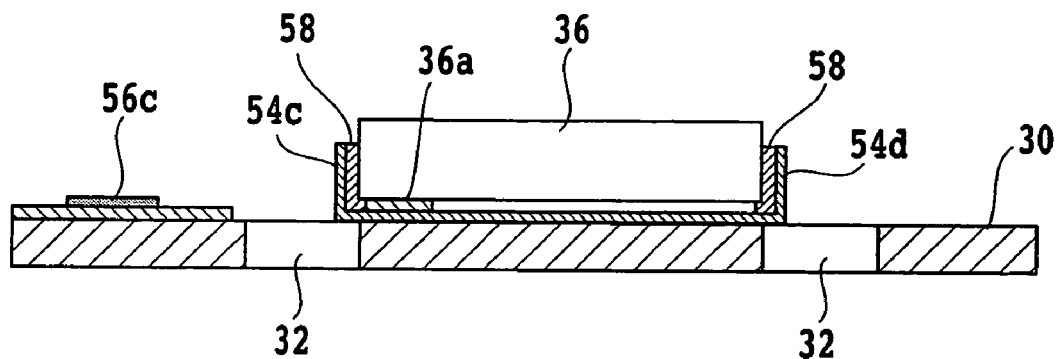
FIG. 7 is a sectional view taken along line 7—7 of FIG. 6.

FIG. 5 shows a plan view of the first and second piezoelectric actuators 34 and 36 in a state wherein they are mounted the gimbal 30. A plating solder film 58 (refer to FIG. 7) is applied in advance to the conductor pads 54a to 54d. Because the conductor pads 54a to 54d are positioned in the openings 32, the conductor pads 54a to 54d are bent by approximately 90° and soldered to electrode terminals of the first and second piezoelectric actuators 34 and 36 as seen in FIG. 6. Referring to FIG. 6, reference character 34a denotes an adhered portion of the first piezoelectric actuator 34 to the gimbal 30, and 36a denotes an adhered portion of the second piezoelectric actuator 36 to the gimbal 30.

Figure 8:
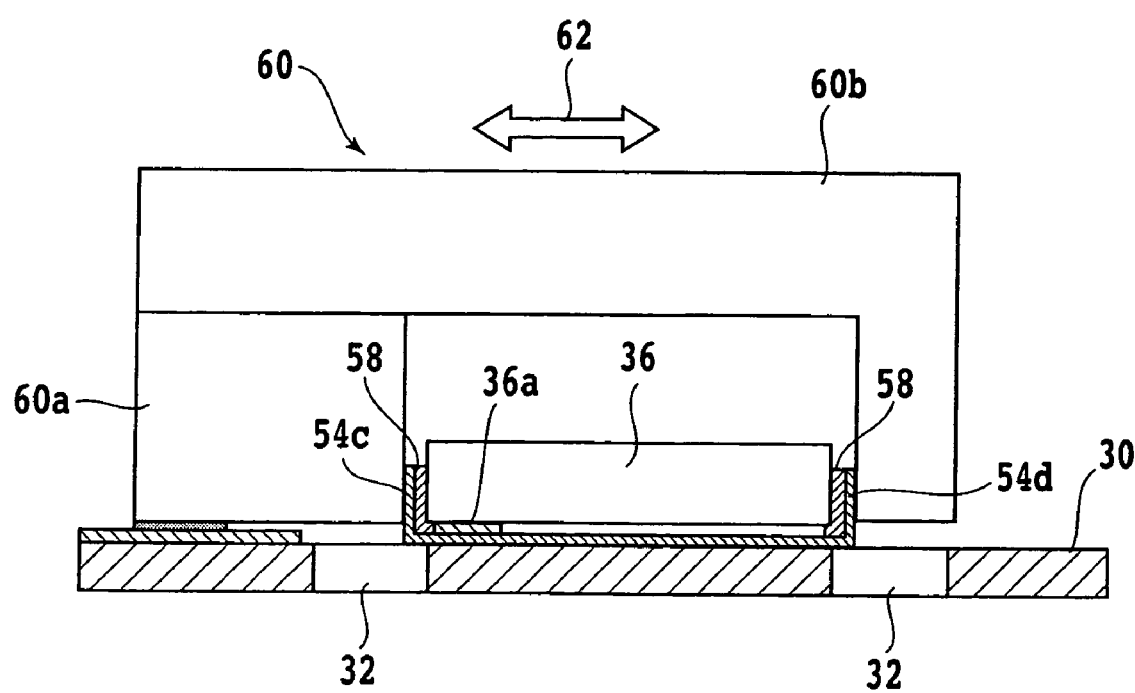
FIG. 8 is a partial sectional view of pads in a state wherein they are soldered by electromagnetic induction using a holding down jig.

The soldering was performed by pressing the conductor pads 54c and 54d bent by 90° against the opposite ends of the piezoelectric actuator 36 using a jig 60 as seen in FIG. 8 and heating only the metal portions to melt the plating solder film 58 by electromagnetic induction heating. The jig 60 has a fixed member 60a and a movable member 60b which is movable in the direction indicated by an arrow mark 62 with respect to the fixed member 60a.

Figure 9:
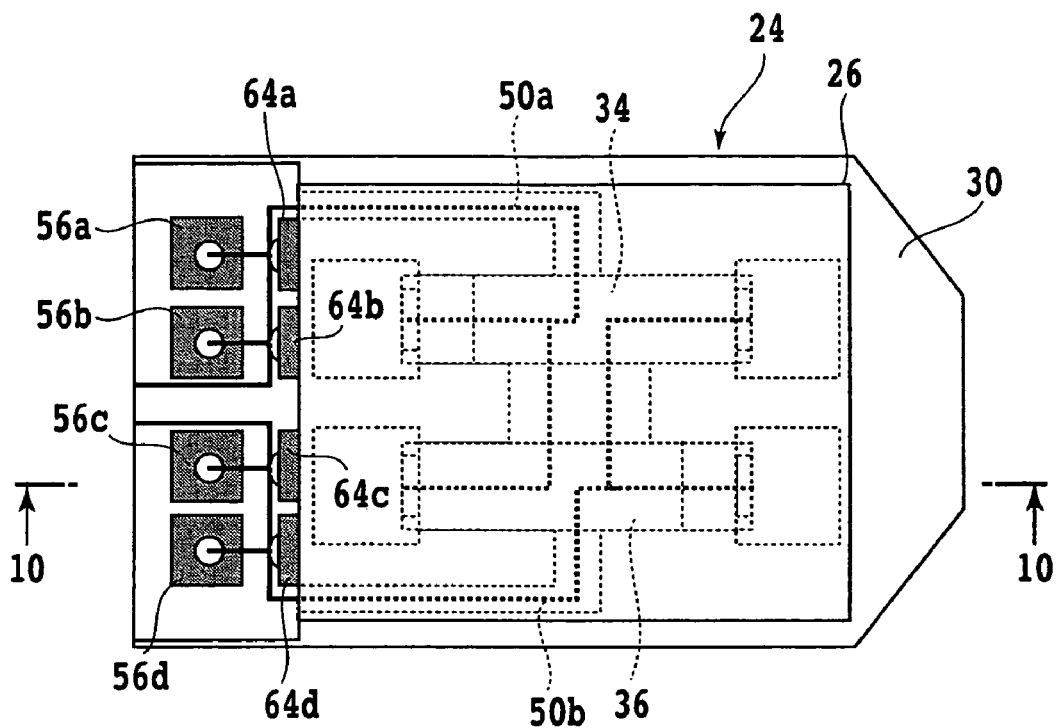
FIG. 9 is a plan view of a head slider in a state wherein it is mounted on the first and second piezoelectric actuators.
Figure 10:
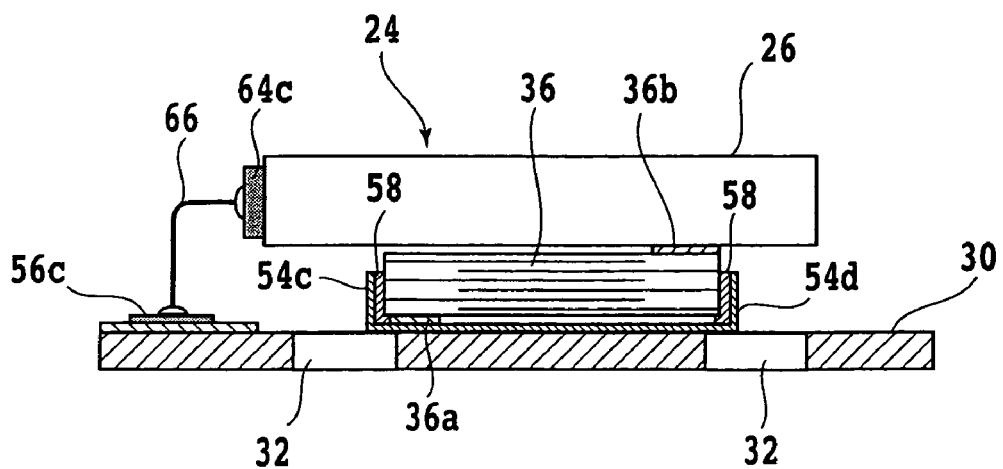
FIG. 10 is a sectional view taken along line 10—10 of FIG. 9.
Figure 11:
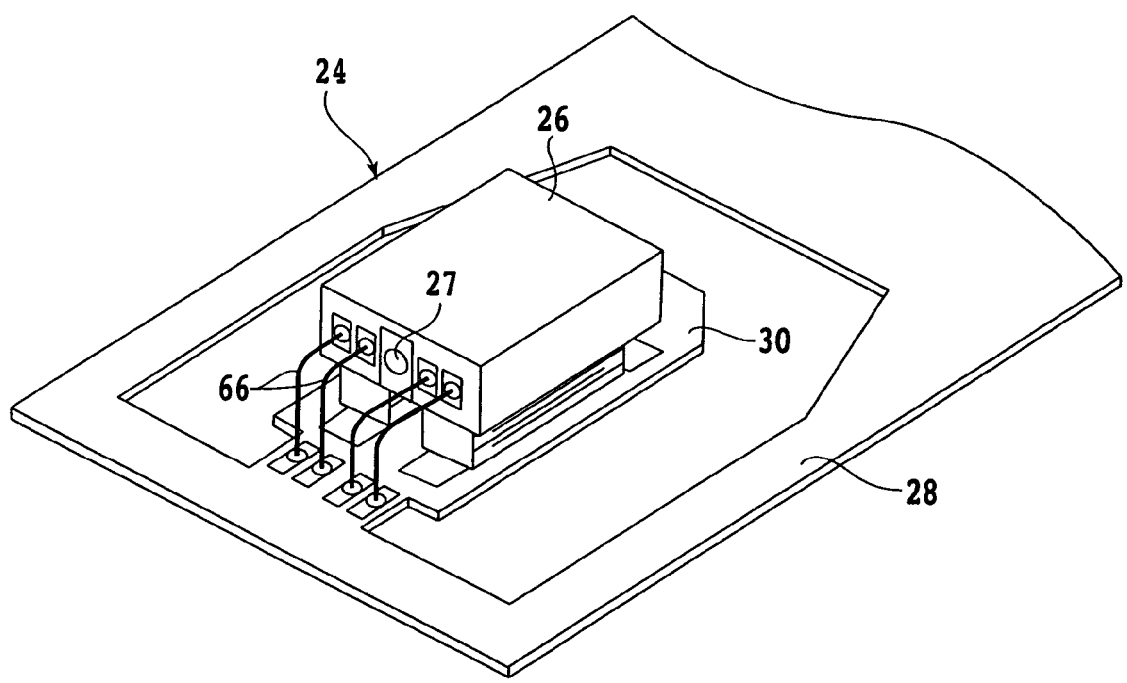
FIG. 11 is a perspective view of a head assembly of another embodiment of the present invention.

Referring to FIG. 9, there is shown a plan view of the head assembly 24 in a state wherein the head slider 26 is mounted on the first and second piezoelectric actuators 34 and 36. FIG. 10 is a sectional view taken along line 10—10 of FIG. 9, and FIG. 11 shows a perspective view of the head assembly 24. The head slider 26 includes terminals 64a and 64b connected to the writing element of the magnetic head element 27 and terminals 64c and 64d connected to the reading element. The conductor pads 56a to 56d and the terminals 64a to 64d are bonding connected to each other, respectively, by bonding wires 66 such as gold wires.

The amount of movement of the magnetic head element 27 part of the head slider 26 was measured on the head assembly 24 produced in such a manner as described above. It was confirmed that, when a voltage of 30 V was applied to the first and second piezoelectric actuators 34 and 36, displacement of 1.0 µm or more was obtained successfully, and the wiring structure of the present invention does not constrain the amount of movement of the magnetic head element 27. According to the present embodiment, because a wiring structure which makes use of an FPC sheet is adopted, wirings for piezoelectric actuator driving and wirings for head element driving can be formed in good order at a very narrow portion. The wiring structure does not constrain the displacement of the piezoelectric actuators, and head assemblies which can achieve high positioning accuracy of a head can be provided in a high yield and at a low cost.

In the following, a piezoelectric actuator suitable for use for the first and second piezoelectric actuators 34 and 36 of the head assembly 24 described above and a production method of the piezoelectric actuator are described. Conventionally, an Ag—Pd electrode is used commonly for electrodes of multi-layer piezoelectric actuators. However, where this Ag—Pd electrode is used, metal sag is likely to appear upon cutting by means of a dicing saw and is likely to make a cause of short-circuiting between electrodes, and it has been found that there is the possibility that use particularly under a high-temperature high-humidity condition may cause migration of Ag. In order to prevent such defects as described above, Pt is used as an electrode material in the multi-layer piezoelectric actuator of the present invention.

Figure 12:
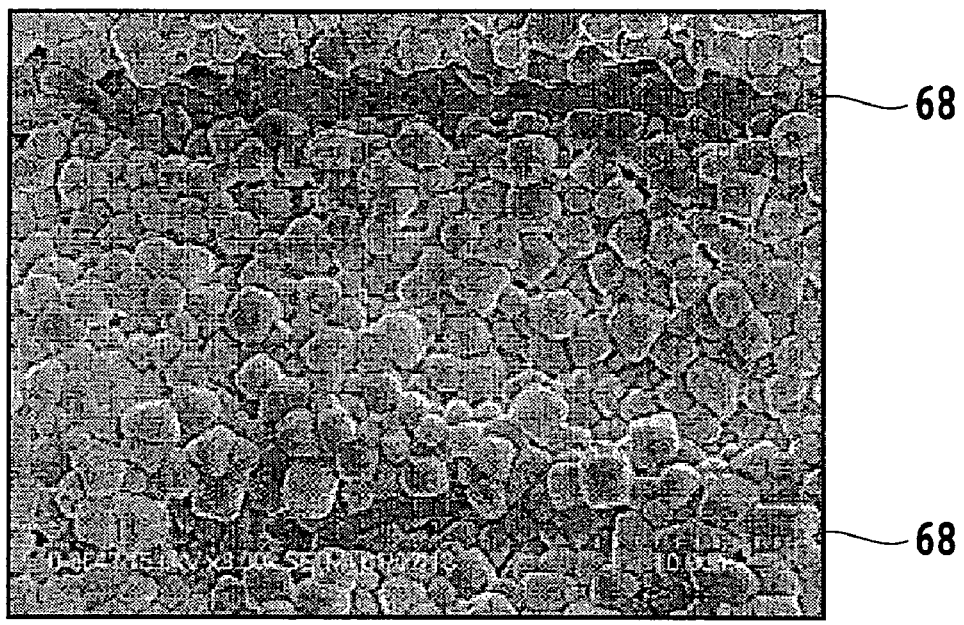
FIG. 12 is a microphotograph of a punched face of a multi-layer structure of PNN—PT-PZ ceramic and Pt electrodes after baking.
Figure 13:
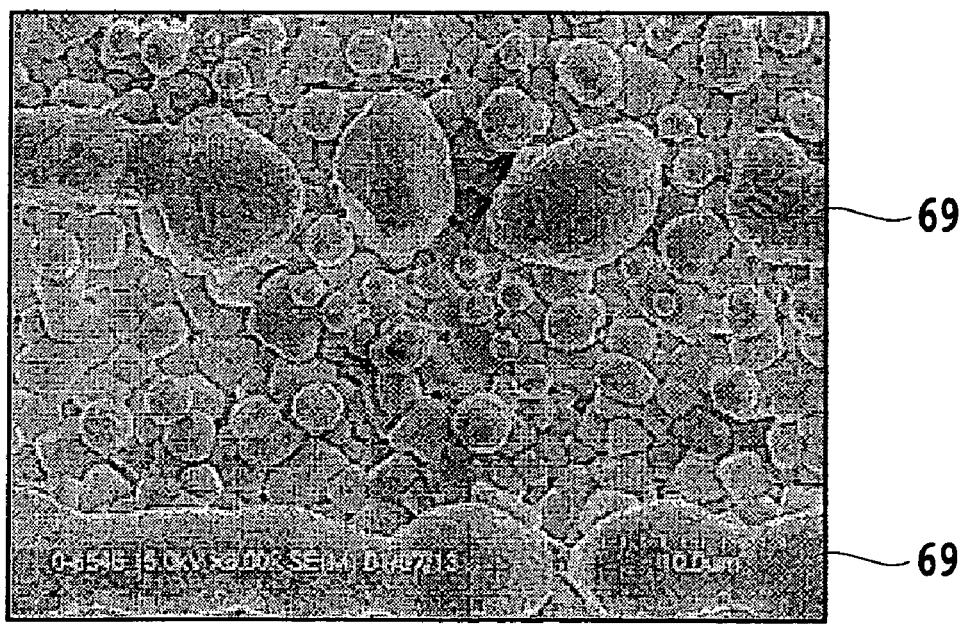
FIG. 13 is a microphotograph of a punched face of a multi-layer structure of PNN—PT-PZ ceramic and Ag—Pb electrodes after baking.

FIG. 12 shows a microphotograph of a punched face after baking of a multi-layer structure of $PbNi_{1/3}Nb_{2/3}O_3$—$PbTiO_3$—$PbZrO_3$ (PNN—PT-PZ) ceramic and Pt electrodes. For comparison, a microphotograph of a punched face after baking of a multi-layer structure of PNN—PT-PZ ceramic and Ag—Pd electrodes is shown in FIG. 13. As apparent from observation of FIG. 12, in the specimen which uses Pt electrodes 68, the Pt electrodes 68 are either retracted to the inner side from the punched face or covered with the piezoelectric ceramic. On the other hand, it can be seen that, in the specimen of FIG. 13 wherein Ag—Pd electrodes 69 are laminated, the Ag—Pd electrodes 69 flow out to the punched surface and the flowing out electrodes are swollen significantly and decrease the distance between the electrodes. From this, while use of an Ag—Pd electrode gives rise to the possibility that electric insulation may not be lost, use of a Pt electrode eliminates the possibility. Therefore, in the multi-layer piezoelectric actuator of the present invention, a Pt electrode is used.

Now, a production process of the multi-layer piezoelectric actuator of the present invention is described with reference to FIGS. 14A to 14G. First, first green sheets 70 each having first electrode patterns 70a made of Pt paste and second green sheets 72 each having second electrode patterns 72a made of Pt paste similarly are prepared. The electrode patterns 70a and 72a are printed, for example, by screen printing. As a piezoelectric material of the first and second green sheets 70 and 72, a green sheet of $PbNi_{1/3}Nb_{2/3}O_3$—$PbTiO_3$—$PbZrO_3$ (PNN—PT—PZ) ceramic was used. The Pt paste contains PNN—PT-PZ powder by 5 to 50 volume % and preferably by 10 to 30 volume %. In the present embodiment, the Pt paste contains PNN—PT-PZ powder by 20 volume %.

Figure 14A:
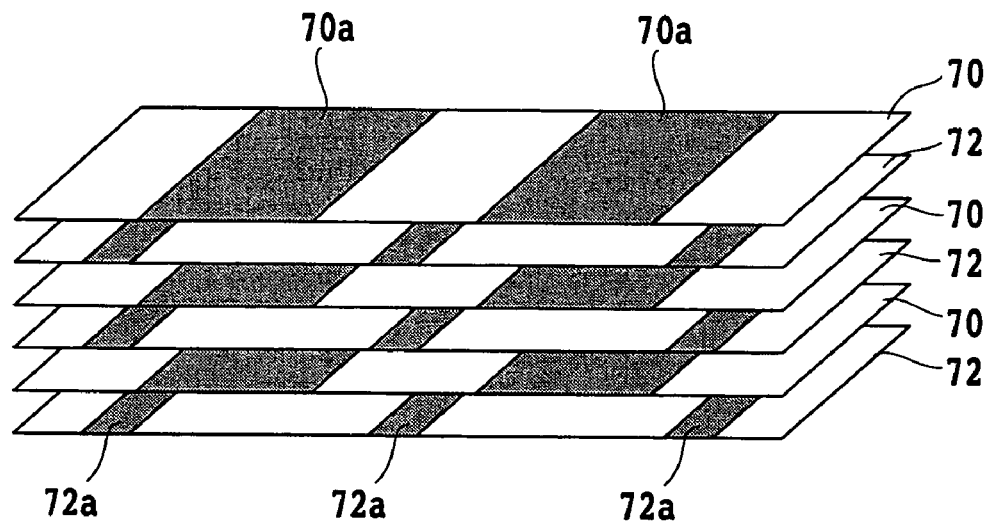
FIGS. 14A to 14G are views illustrating a production process of a piezoelectric actuator according to an embodiment of the present invention.
Figure 14B:
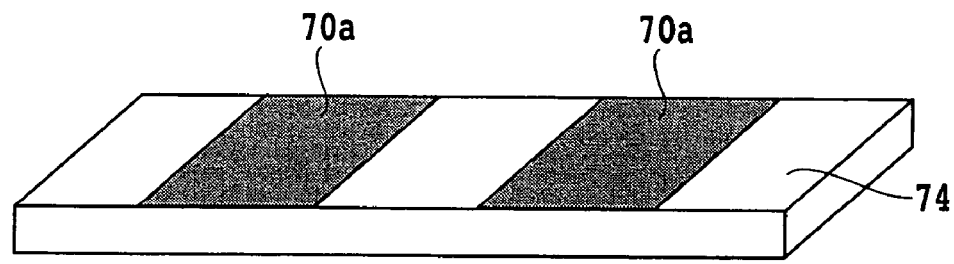
Figure 14C:
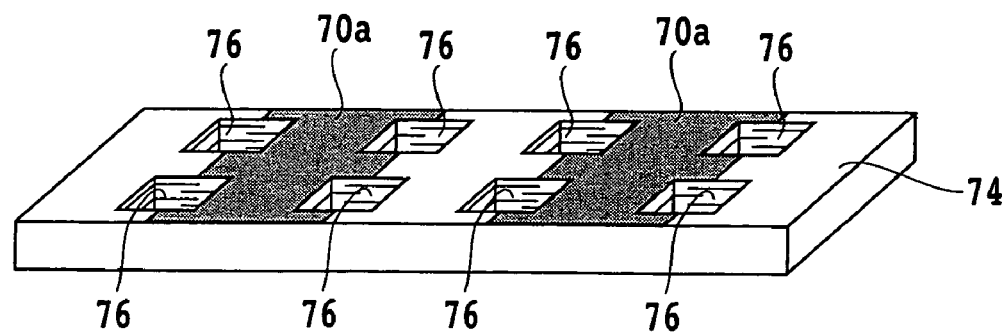

If the first green sheets 70 and the second green sheets 72 produced in such a manner as described above are laminated alternately as seen in FIG. 14A and contact bonded by a predetermined pressure so that the first electrode patterns 70a and the second electrode patterns 72a partly overlap with each other to obtain a desired active layer, then a green sheet lamination article 74 shown in FIG. 14B is obtained. Then, the green sheet lamination article 74 is blanked, at a portion thereof including the first and second electrode patterns 70a and 72a, into a desired shape using a desired die (FIG. 14C). Reference numeral 76 denotes a blanked portion (punched portion).

Figure 14D:
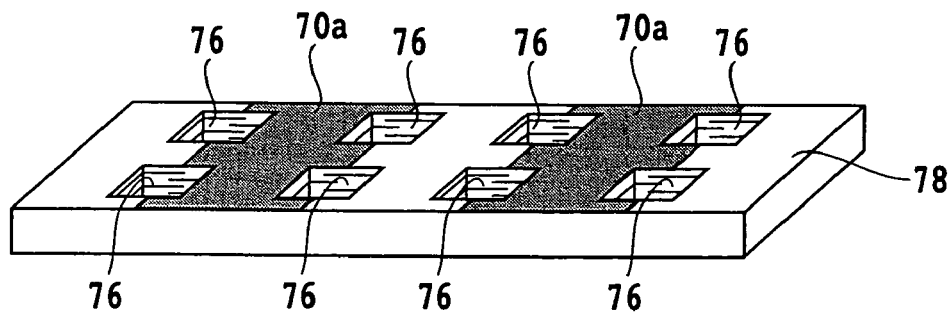
Figure 14E:
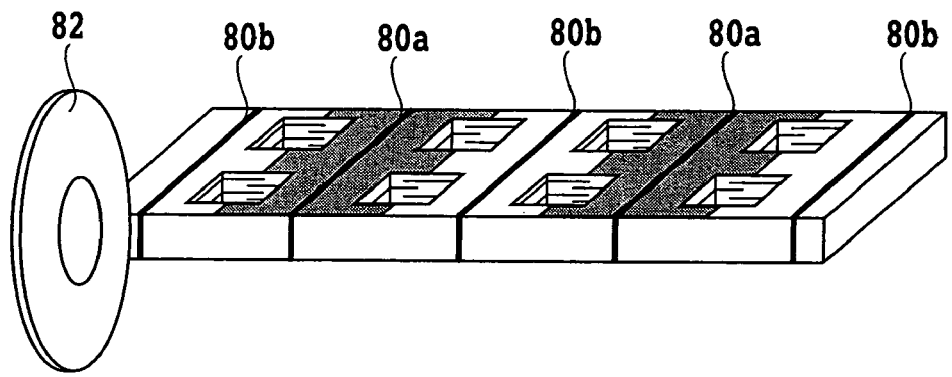
Figures 14F, 14G:
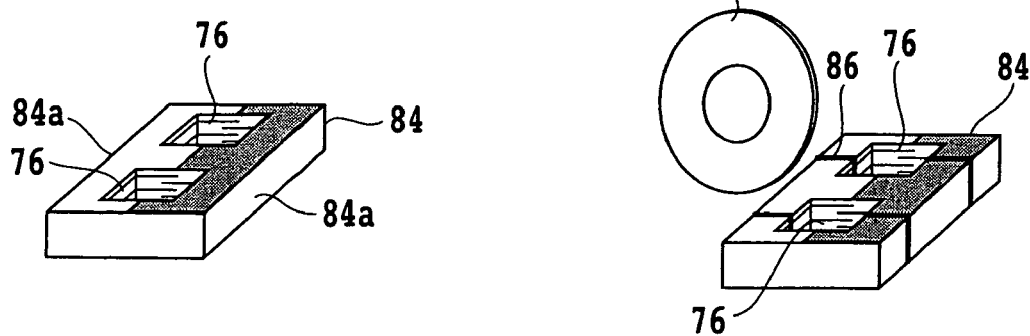

Then, the green sheet lamination article 74 was heated at approximately 500° C. in the atmospheric air for four hours to degrease the green sheet lamination article 74, and then heated at 1,050° C. similarly in the atmospheric air for three hours to bake the green sheet lamination article 74 to produce a piezoelectric substrate 78 shown in FIG. 14D. Then, the piezoelectric substrate 78 was cut in a first direction at each of portions 80a thereof which include only the first electrode patterns and portions 80b which include only the second electrode pattern using a dicing saw 82 as seen in FIG. 14E to obtain a bar-shaped piezoelectric substrate 84 shown in FIG. 14F. A surface electrode was formed on the opposite side faces 84a of the bar-shaped piezoelectric substrate 84 by vapor deposition or the like, and then the bar-shaped piezoelectric substrate 84 was cut in a second direction perpendicular to the first direction at a position 86 thereof including the blanked portions 86 using the dicing saw 82 as seen in FIG. 14G to produce a piezoelectric actuator 88 shown in FIG. 15.

Figure 15:
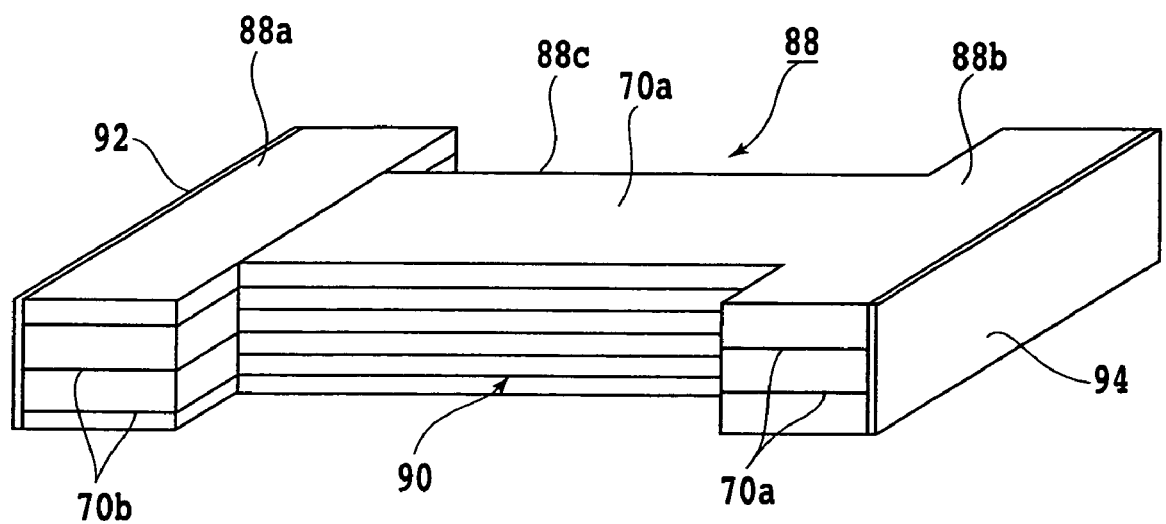
FIG. 15 is a perspective view of a piezoelectric actuator produced by the production process of the present invention.

As seen in FIG. 15, the piezoelectric actuator 88 includes an active layer 90 including the first electrodes 70a and the second electrodes 70b overlapping with each other and has surface electrodes 92 and 94 formed at the opposite end faces thereof. A first end portion 88a which is an inactive layer and a second end portion 88b also which is an inactive layer have a width greater than the width of an intermediate portion 88c which is an active layer.

Figure 16:
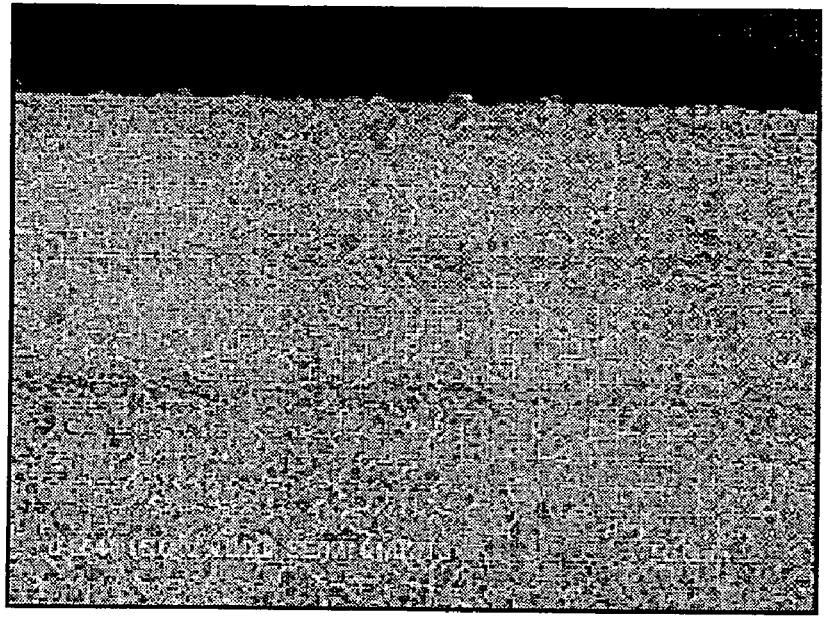
FIG. 16 is a microphotograph of a face, which has been punched before baking, after baking.
Figure 17:
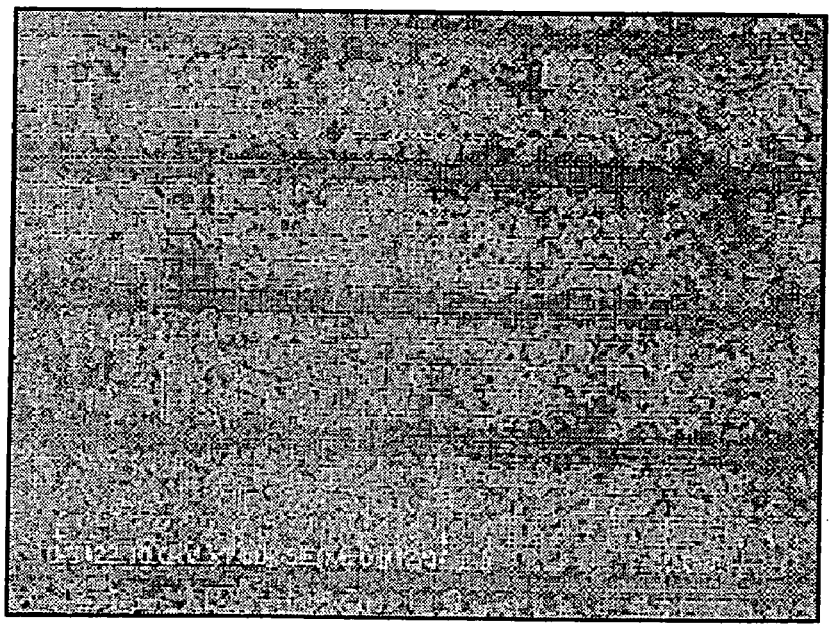
FIG. 17 is a microphotograph of a cut face cut by a dicing saw after baking.

Referring to FIG. 16, there is shown a microphotograph of a face, formed by punching before baking, after punching. FIG. 17 is a microphotograph of a cut face obtained by cutting by means of a dicing saw after baking. Where FIGS. 16 and 17 are observed for comparison, according to the embodiment of the present invention shown in FIG. 16, when compared with the face shown in FIG. 17 obtained by cutting by means of a conventional dicing saw, it can be confirmed that, although the ceramic layer thickness is substantially equal, the apparent electrode thickness exposed to the side face is thinner and the electrodes exhibit such a state that they are partly covered with the ceramic with the distance therebetween expanded. While the present embodiment presupposes that the opposite side faces of a piezoelectric actuator are punched before baking, owing to circumstances of the reliability and the production process, only one side face may be punched. The amount of movement of the slider end portion (head element face) was measured using the produced piezoelectric actuator. As a result, it was confirmed that an amount of movement of 1.0 µm or more is obtained by application of a voltage of 30 V to the piezoelectric actuator.

According to the head assembly of the present invention, the center of gravity of a head slider and the axis of pivotal motion of a pair of piezoelectric actuators can be made coincide with each other. Further, an amount of movement of the head slider end portion (head element face) by 1.0 µm or more can be obtained by application of a voltage of approximately 30 V to the piezoelectric actuators, and an in-plane resonance frequency of 20 kHz or more can be obtained. Since an FPC sheet is utilized for wirings for piezoelectric actuator driving and for head element driving, the displacement of the piezoelectric actuators is not disturbed, and wiring of lines at a very narrow portion can be performed readily and in good order. As a result, a head assembly which can achieve a high degree of positioning accuracy can be produced with a high yield and at a low cost.

Further, according to the piezoelectric actuator of the present invention, sag of an electrode upon individual cutting which appears in conventional piezoelectric actuators can be prevented, and the electric reliability of the piezoelectric actuator can be enhanced. A head assembly which uses the piezoelectric actuator can be improved in terms of the reliability.

What is claimed is:

1. A head assembly, comprising:
    a suspension having a gimbal;
    a flexible printed wiring sheet having a plurality of first conductor patterns for piezoelectric actuator driving, a plurality of first pads individually connected to ends of said first conductor patterns, a plurality of second conductor patterns for head element driving, and a plurality of second pads individually connected to ends of said second conductor patterns, said flexible printed wiring sheet being adhered to said suspension except said first pads such that said first and second pads are positioned on said gimbal, said first pads being left unattached to said suspension;
    a first piezoelectric actuator having a first face, a second face on the opposite side to said first face, a first end, a second end, a plurality of first electrodes, a plurality of second electrodes provided alternately with said first electrodes, a first adhesion portion provided on said first face adjacent said first end, and a second adhesion portion provided on said second face adjacent said second end, said first piezoelectric actuator being adhered at said first adhesion portion thereof to said gimbal;
    a second piezoelectric actuator having a third face on the same side as that of said first face, a fourth face on the opposite side to said third face, a third end on the same side as that of said first end, a fourth end, a plurality of third electrodes, a plurality of fourth electrodes provided alternately with said third electrodes, a third adhesion portion provided on said third face adjacent said fourth end, and a fourth adhesion portion provided on said fourth face adjacent said third end, said second piezoelectric actuator being disposed substantially in parallel to said first piezoelectric actuator and adhered at said third adhesion portion thereof to said gimbal;
    a head slider mounted on said first and second piezoelectric actuators and adhered to said first piezoelectric actuator at said second adhesion portion and to said second piezoelectric actuator at said fourth adhesion portion, said head slider having a head element and a plurality of terminals connected to said head element; and
    elements for individually connecting said second pads to said terminals;
    said first pads being individually connected to said first, second, third and fourth electrodes.

2. A head assembly according to claim 1, wherein said gimbal has openings at portions thereof which correspond to said first pads, and said first pads are bent substantially at a right angle individually connected to said first and second ends of said first piezoelectric actuator and said third and fourth ends of said second piezoelectric actuator.

3. A head assembly according to claim 2, wherein each of said first pads has a plating solder film thereon, and said first pads are individually soldered to said first and second ends of said first piezoelectric actuator and to said third and fourth electrodes of said second piezoelectric actuator.

4. A head assembly according to claim 1, wherein said elements for individually connecting said second pads and said electrodes are formed from bonding wires.

* * * * *